United States Patent [19]

Kimura et al.

[11] Patent Number: 5,146,468
[45] Date of Patent: Sep. 8, 1992

[54] GAS DOPING OF SOLIDS BY CRYSTAL GROWTH

[75] Inventors: Hiroshi Kimura, Northridge; Ricardo C. Pastor, Manhattan Beach, both of Calif.

[73] Assignee: Hughes Aircraft Company, Los Angeles, Calif.

[21] Appl. No.: 627,796

[22] Filed: Dec. 14, 1990

[51] Int. Cl.$^5$ ............................................. H01S 3/22
[52] U.S. Cl. ........................................ 372/59; 372/41
[58] Field of Search ............................ 372/41, 42, 59

[56] References Cited

U.S. PATENT DOCUMENTS 4,638,485  1/1987  Gellermann et al. ................. 372/42

Primary Examiner—Léon Scott, Jr.
Attorney, Agent, or Firm—E. E. Leitereg; W. K. Denson-Low

[57] ABSTRACT

A high concentration of diatomic molecules is caged in a host crystal by a crystal growth process, in which all other internal degrees of freedom of the diatomic molecule, except the vibrational, are frozen. Such a system provides an efficient mid-infrared, solid-state laser that can be pumped by a laser diode. Other uses include magnetic (Faraday) rotators, electro-optic switches, and Q-switches. The crystal growth process employs Czochralski-type or Bridgman-type processes under high pressure to introduce the diatomic molecule into the host lattice at a temperature slightly above the melting point of the host crystal, followed by slow cooling.

27 Claims, No Drawings

GAS DOPING OF SOLIDS BY CRYSTAL GROWTH

CROSS-REFERENCE TO RELATED APPLICATION

The present application is related to Ser. No. 627,786, filed Dec. 14, 1990, which is directed to impregnation of a solid from the gas phase. In the related application, diatomic species (neutral and charged) are used to dope a crystal host.

BACKGROUND OF THE INVENTION

1. Field of the Invention

The present invention is directed to a crystal growth process, and, more particularly, to a process for caging a high concentration of diatomic molecules in solids. The present invention is also directed to solid-state lasers formed thereby.

2. Description of Related Art

Under proper excitation, a diatomic molecule caged in a solid such that all other internal degrees of freedom are frozen, other than vibrational, serves as a laser source through a cascade-type relaxation of its excited vibrational states.

The 2 to 5 μm wavelength region is of interest to the development of solid-state mid-IR lasers. There are many diatomic molecules whose fundamental vibration wavelength falls within the given range. However, the use of such molecules for laser applications as a gas suffers from two drawbacks:

(1) operating pressure must be low; otherwise, the vibrational output is collision-broadened; and (2) rotational degrees of freedom are active, which provide a source of broadening and an added handle to radiationless relaxation of the excited state (vibrational).

At present, no known state-of-the-art techniques are known which are designed to trap a high concentration of gas molecules in a solid with chosen restricted degrees of freedom.

SUMMARY OF THE INVENTION

In accordance with the invention, the drawbacks mentioned above are overcome by trapping a diatomic molecule in an ionic solid through growth of the tailored host (ionic crystal) under high pressure of the gas that provides the tenant molecule.

The process of the invention introduces a high concentration of a diatomic molecule into a host crystal, comprising heating the host crystal in an atmosphere of a gas of the diatomic molecule under high pressure sufficient to achieve a doping concentration of about $10^{19}$ to $10^{20}$ cm$^{-3}$.

The first limitation above is avoided because the caged molecule is well-shielded from the others. The second limitation can be eliminated by choosing the proper size fit between tenant (diatomic molecule) and host (crystal).

As a result, efficient mid-infrared, solid-state lasers that can be pumped by a laser diode can be packaged in a very compact manner for a variety of uses, including as instruments for monitoring and control of environmental pollution. Other uses include magnetic (Faraday) rotators and Q-switches.

DESCRIPTION OF THE PREFERRED EMBODIMENTS

In accordance with the invention, diatomic molecules are trapped in an ionic solid through growth of the host under high pressure of the gas that provides the tenant molecule. In choosing the proper size fit between tenant and host, the host crystal must satisfy three constraints:

(1) the crystal must, of course, be transparent to the output wavelength;

(2) the crystal interstice must be matched to accommodate the van der Waal radius of the tenant molecule, thereby freezing all internal degrees of freedom, except vibration; and (3) the host crystal melting point must not be too high, because solubility of the gas in the melt is proportional to gas pressure, but depends inversely on operating temperature (Henry's Law).

The process of the invention does not limit the operating pressure, since the caged molecule is well-shielded from the others. Further, rotational degrees of freedom are frozen, due to the judicious choice of tenant and host, based on the considerations given above.

The process of the invention preferably involves the use of high-pressure Czochralski-type or Bridgman-type apparatus which can operate to at least about 1,500° C. under gas pressures up to at least about 150 atm. Czochralski-type and Bridgman-type crystal growth apparatus are advantageously employed in the practice of the invention, since both permit crystal growth under high pressure. Other well-known crystal growth techniques that are adaptable to high pressures may also be employed.

Examples of suitable tenant molecules useful in the practice of the invention are listed in Table I below, together with their $\lambda_f$ (fundamental vibration wavelength) in the 2 to 5 μm range of interest and $r_v$ (van der Waal radius):

TABLE I

| Examples of Diatomic Molecules. | | |
|---|---|---|
| Molecule | $\lambda_f$, μm | $r_v$, Å |
| H$_2$ | 2.27 | 1.38 |
| D$_2$ | 3.20 | 1.38 |
| HCl | 3.34 | 1.59 |
| HBr | 3.78 | 1.64 |
| N$_2$ | 4.24 | 1.57 |
| CO | 4.61 | 1.58 |
| NO | 5.25 | 1.40 |

With the foregoing tenants, the following ionic metal halides are good candidate host materials. Table II lists the crystal, its crystal structure (fcc=face-center cubic; sc=simple cubic), the $r_i$ (interstitial size) and mp (melting point).

TABLE II

| Examples of Host Materials. | | | |
|---|---|---|---|
| Crystal | Structure | $r_i$, Å | mp, °C. |
| LiF | fcc | 1.38 | 842 |
| LiCl | fcc | 1.88 | 614 |
| NaF | fcc | 1.94 | 988 |
| KF | fcc | 1.91 | 846 |
| CsI | sc | 1.35 | 621 |
| TlI | sc | 1.24 | 440* |

*Metastable state is orthorhombic, which changes to sc on cooling.

The interstitial size is matched to the size of the tenant molecule. The tenant molecule goes into the host interstitially; the molecule is "locked in" to prevent translational and rotational modes, allowing only vibrational modes.

The foregoing Tables provide an indication of examples of suitable hosts and tenant molecules. The crystal host may comprise any of the Group I, II, III and IV halides, Group III-V oxides, and silicon and germanium. Examples of Group I halides are given in Table II. Examples of Group II halides include barium halides. Examples of Group III halides include rare-earth halides. Examples of Group IV halides include Ti, Zr, and Hf halides. Examples of III-V oxides include yttrium vanadate, aluminum phosphate, etc.

In selecting a suitable host, it must also be transparent to the pump radiation as well as to the vibrational emission of the tenant molecule (dopant). Determination of the extent of transparency required is readily done, once the host material and tenant molecule are known.

The size of the tenant molecule must be reasonably matched to the opening in the host crystal. However, the tenant can be somewhat larger, although this will create some strain in the host lattice. The ratio of the size of the opening to the size of the tenant may vary ±15%; the selection is advantageously based on the values given in A. Goldsmith, *Handbook of Thermophysical Properties of Solid Materials*, The MacMillan Company, New York (1961).

A diatomic molecule has six degrees of freedom: three translational, two rotational, and one vibrational. Molecules with more than two atoms have more than one vibrational degree of freedom, and thus are not useful in the practice of the invention. In order to construct a laser operating in the infrared, only those diatomic molecules that vibrate in the infrared are useful; examples of these are listed in Table I above.

The concentration range of the tenant molecule in the host crystal may range from about $10^{19}$ to $10^{22}$ cm$^{-3}$ for most applications. For laser applications, if the concentration is much larger than $10^{20}$ cm$^{-3}$, then quenching of the emission output will occur. Also, the strain in the host may cause it to be brittle; cracking during fabrication presents a problem.

It will be appreciated that these gas molecules presently lase in the gas phase only at millimeter pressures; higher pressures decrease lasing due to collisions, as indicated earlier. A concentration of the tenant molecule of about $10^{19}$ cm$^{-3}$ in a solid is equivalent to 1 atm. Thus, it will be seen that with a substantially increased concentration of the diatomic molecule, then the output intensity increases with concentration as long as the pumping source can meet the demand for excitation. Otherwise, the inner part of the material will not lase. The unexcited fraction can (by resonance absorption) trap the output radiation and give the pulse output a "long tail". Yet, there is no pressure broadening, since the molecules are caged.

The operating temperature of the laser is as high as $-78°$ C. (the temperature of solid $CO_2$). The laser may also be operated at 77K, the temperature of liquid $N_2$.

The process for introducing the tenant is as follows: a high pressure furnace or pressure vessel is employed for Czochralski-type or Bridgman-type crystal growth. The solid host is placed in a crucible and heated to slightly above the melting point in the presence of about 50 to 60 atm of the gaseous tenant diatomic molecule. As used herein, the term "slightly above melting" means that the temperature is sufficiently high to achieve a homogeneous melt. The pressure range will vary, depending on the Henry-Law constant; the pressure range given above is one that is typical but by no means unique.

The solid is held at that temperature and pressure for a period of time to permit equilibration and to dissolve the tenant in the host. A suitable time is on the order of 0.5 hour for a 100-ml melt. The crystal is grown and then slowly cooled. Cooling over a 24 hour period should suffice to avoid extensive cracking.

TGA analysis shows that the gas stays in the solid at all temperatures below the melting point of the solid host, which is a consequence of size matching, as taught above. If the tenant-molecule size were quite small compared to the host site, ex-solution behavior would not be "thermally sharp"; lower-temperature leakage would manifest.

Due to the convection of the melt, complete homogeneity is achieved.

At a pressure range of about 50 to 60 atm, a concentration of about $5 \times 10^{20}$ cm$^{-3}$ is obtained in the gas phase over the temperature range of about 600° to 700° C. (the melting point of some of the host materials listed in Table II). Use of a crystal having a higher melting point could require 50 to 60 atm just to obtain a doping concentration of $10^{19}$ cm$^{-3}$; for example, $BaF_2$ melts at a temperature of about 1,350° C.

Consider a system which achieves a gas-doping of the solid of $10^{20}$ cm$^{-3}$. That amounts to a Henry-Law constant, $k_H = 10^{20}/(5 \times 10^{20})$, or $k_H = 0.2$ at 600° C. Adopt a typical value of $\Delta E = 10$ kcal for the dissolution for which $$\exp\left[\frac{\Delta E}{R}\left(\frac{T_2 - T_1}{T_1 T_2}\right)\right] = 0.07$$

for $T_2 = 1350 + 273$ and $T_1 = 600 + 273$. Thus, if $k_1(600°$ C.$) = 0.2$ and $\Delta E = 10$ kcal, then $k_H(1,350°$ C.$) = 0.014$. Hence, the concentration in the solid at 1,350° C. of a gas concentration of $5 \times 10^{20}$ cm$^{-3}$ is equal to $5 \times 10^{20} \times 0.014 = 7 \times 10^{18}$ or $\approx 10^{19}$ cm$^{-3}$.

The pressure range is related to the melting point of the host as follows: the gas concentration is given as $$\frac{n}{V} = \frac{P(\text{atm}) \times 6.02 \times 10^{23}}{82.05 \times T_{mp}}$$

where $T_{mp}$ is fixed by the choice of the host material. Thus, P determines the gas concentration. The caging concentration C and the $k_H$ of the melt are then related by $$C = k_H \frac{n}{V} = \frac{k_H P}{T_{mp}} \times 7.34 \times 10^{21}$$

If the choice is made of $C = 10^{19}$ cm$^{-3}$ in the solid, for example, then the equation of state is $k_H P/T_{mp} = 1.36 \times 10^{-3}$.

The foregoing description has been presented largely in terms of using the molecularly-caged material in laser applications. However, other applications are also possible with these materials.

For example, such materials may be applied to act as magnetic (Faraday) rotators at wavelengths not far removed from the fundamental absorption of the tenant molecule. Consider the caging of NO in a crystal matrix at a level of $10^{21}$ to $10^{22}$ cm$^{-3}$. When such a material is subjected to a magnetic field, there is a tendency to line up the magnetic dipoles, competing with the disordering tendency of the thermal state (measured by kT). Of course, the extent of lining improves as the material is cooled. The oscillating magnetic vector of the material acts on the oscillating magnetic field of the electromagnetic wave, resulting in a turning of the plane of polarization. The effect becomes very big when the two oscillations are closely-matched in frequency (i.e., resonance).

Consider now a material where the cage diatomic has a sizable electric dipole moment. The lining up of this dipole will cause the refractive index to change with the applied electric field. Thus, one has an electro-optic switch.

This class of materials may also find application as a passive Q-switch, or a bleachable absorber. Consider a crystal matrix where CO molecules have been caged to a level of $10^{21}$ to $10^{22}$ cm$^{-3}$. This material provides a solid which potentially can Q-switch $CO_2$ gas lasers at 4.6 μm to produce giant pulses.

EXAMPLES

EXAMPLE 1

CsBr:CO

The charge to grow CsBr crystal doped with CO was prepared by placing CsBr powder in a vitreous carbon crucible. The charge was then loaded into a Melbourn High Pressure Furnace (Materials Research Limited, Melbourn, England). The chamber containing the charge was evacuated to exclude oxygen, purged with Ar, and filled with 120 psi CO gas at room temperature. The charge was heated to approximately 640° C., 10° C. above the melting point, and the chamber was refilled with CO gas to 600 psi (40 atm). The melt was allowed to equilibrate with the ambient gas, CO, for 1 hour before cool down. The melt was then cooled at a rate of 5° C. per hour to approximately 580° C., and the heater was turned off. The surface of the melt was discolored black due to disproportionation of CO gas to C(s) and $CO_2$ gas at temperatures below 700° C.

Determination of the caging ability of CO gas was performed by thermogravimetric analysis (TGA). At the melting of CsBr, the weight loss was 2%, which corresponds to a concentration of $1.8 \times 10^{21}$ cm$^{-3}$, assuming that the weight loss was due only to CO gas evolution.

The gas concentration at 630° C. (mp) is $3.3 \times 10^{20}$ cm$^{-3}$. The solid concentration is $1.8 \times 10^{21}$ cm$^{-3}$; therefore, $k_H = 5.5$, using the equation given earlier. Thus, in this Example, CO is more soluble in the condensed phase (CsBr) than in the gas phase.

Example 2

CsCl:Ar

This crystal was grown by the Czochralski method. CsCl powder was placed in a vitreous carbon crucible and loaded into the Melbourn furnace, and filled with Ar gas after evacuating the chamber. The charge was heated to the melting point, and 800 psi (53 atm) of Ar gas was introduced. While Ar is monatomic, this species is of interest for "double doping", where the Ar molecule is a sensitizer to the primary dopant (say, CO). Such a system would be useful in the following application: an outside pump (say, an argon laser) excites Ar, which, by virtue of its proximity, transfers the excitation to the vibrational manifold of CO.

After growing approximately 14 g crystal, the crystal was cooled at a slow rate of 5° C. per hour. TGA thermogram showed a weight loss of 7%, corresponding to a caging density of $4 \times 10^{21}$ cm$^{-3}$ Ar in CsCl, assuming that the observed weight loss was due only to the escape of Ar from the condensed phase.

The gas concentration at 650° C. (mp) is $(53 \times 6.02 \times 10^{23})/[82.05 \times (650 + 273)] = 4.2 \times 10^{20}$ cm$^{-3}$. Thus, $k_H = (4 \times 10^{21})/(4.21 \times 10^{20}) = 9.5$, showing high solubility in the condensed phase of CsCl as compared to that of the gas phase.

What Is Claimed Is:

1. A process for introducing a high concentration of a neutral diatomic molecule into a host crystal, comprising melting said host crystal in an atmosphere of a gas of said neutral diatomic molecule under high pressure sufficient to achieve a doping concentration of about $10^{19}$ to $10^{22}$ cm$^{-3}$.

2. The process of claim 1 wherein said crystal has interstices that are within ±15% of the van der Waal radius of said neutral diatomic molecule.

3. The process of claim 1 wherein said host crystal is selected from the group consisting of Group I halides, Group II halides, Group III halides, Group IV halides, Group III-V oxides, silicon, and germanium.

4. The process of claim 3 wherein said host crystal is selected from the group consisting of LiF, LiCl, NaF, KF, CsI, TlI, barium halides, rare-earth halides, Ti, Zr, and Hf halides, yttrium vanadate, and aluminum phosphate.

5. The process of claim 1 wherein said neutral diatomic molecule is selected from the group consisting of $H_2$, $D_2$, HCl, HBr, $N_2$, CO, and NO.

6. The process of claim 1 wherein said host crystal is heated to a temperature slightly above its melting point and held at said temperature and said pressure for a period of time.

7. The process of claim 1 where said pressure is determined by the equation $$C = \frac{k_H P}{T_{mp}} \times 7.34 \times 10^{21}$$

where C is the caging concentration, $k_H$ is the Henry-Law constant, P is the pressure, and $T_{mp}$ is the melting point of the solid.

8. Product produced by the process of claim 1.

9. A process for fabricating a solid-state laser for operation in the mid-infrared region, including introducing a high concentration of a neutral diatomic molecule into a host crystal, comprising melting said host crystal in an atmosphere of a gas of said neutral diatomic molecule under high pressure sufficient to achieve a doping concentration of about $10^{19}$ to $10^{20}$ cm$^{-3}$.

10. The process of claim 9 wherein said crystal has interstices that are within ±15% of the van der Waal radius of said neutral diatomic molecule.

11. The process of claim 9 wherein said host crystal is selected from the group consisting of Group I halides, Group II halides, Group III halides, Group IV halides, Group III-V oxides, silicon, and germanium.

12. The process of claim 11 wherein said host crystal is selected from the group consisting of LiF, LiCl, NaF, KF, CsI, TlI, barium halides, rare-earth halides, Ti, Zr, and Hf halides, yttrium vanadate, and aluminum phosphate.

13. The process of claim 9 wherein said neutral diatomic molecule is selected from the group consisting of $H_2$, $D_2$, HCl, HBr, $N_2$, CO, and NO.

14. The process of claim 9 wherein said host crystal is heated to a temperature slightly above its melting point and held at said temperature and said pressure for a period of time.

15. The process of claim 9 where said pressure is determined by the equation $$C = \frac{k_H P}{T_{mp}} \times 7.34 \times 10^{21}$$

where C is the caging concentration, $k_H$ is the Henry-Law constant, P is the pressure, and $T_{mp}$ is the melting point of the solid.

16. Product produced by the process of claim 9.

17. A solid-state laser for operation in the mid-infrared region comprising a solid laser host material having incorporated therein a neutral diatomic molecule in a concentration ranging from about $10^{19}$ to $10^{20}$ cm$^{-3}$, wherein said laser host material is melted in a gas of said neutral diatomic molecule under high pressure sufficient to achieve said doping concentration.

18. The laser of claim 17 wherein said laser host material has interstices that are within ±5% of the van der Waal radius of said neutral diatomic molecule.

19. The laser of claim 17 wherein said laser host material is selected from the group consisting of Group I halides, Group II halides, Group III halides, Group IV halides, Group III-V oxides, silicon, and germanium.

20. The laser of claim 19 wherein said laser host material is selected from the group consisting of LiF, LiCl, NaF, KF, CsI, TlI, barium halides, rare-earth halides, Ti, Zr, and Hf halides, yttrium vanadate, and aluminum phosphate.

21. The laser of claim 17 wherein said neutral diatomic molecule is selected from the group consisting of $H_2$, $D_2$, HCl, HBr, $N_2$, CO, and NO.

22. A solid-state device comprising a solid host material having incorporated therein a neutral diatomic molecule in a concentration ranging from about $10^{19}$ to $10^{22}$ cm$^{-3}$, wherein said laser host material is melted in a gas of said neutral diatomic molecule under high pressure sufficient to achieve said doping concentration and wherein said neutral diatomic molecule has a sizable electric dipole moment and said material, upon application of an electric field, experiences a change in its refractive index to form an electro-optic switch.

23. The device of claim 22 wherein said host material has interstices that are within ±15% of the van der Waal radius of said neutral diatomic molecule.

24. The device of claim 22 wherein said host material is selected from the group consisting of Group I halides, Group II halides, Group III halides, Group IV halides, Group III-V oxides, silicon, and germanium.

25. The device of claim 24 wherein said host material is selected from the group consisting of LiF, LiCl, NaF, KF, CsI, TlI, barium halides, rare-earth halides, Ti, Zr, and Hf halides, yttrium vanadate, and aluminum phosphate.

26. The device of claim 22 wherein said neutral diatomic molecule is selected from the group consisting of $H_2$, $D_2$, HCl, HBr, $N_2$, CO, and NO.

27. The device of claim 22 wherein said concentration ranges from about $10^{21}$ to $10^{22}$ cm$^{-3}$ and said material, upon subjection to a magnetic field, comprises a magnetic rotator.

* * * * *

UNITED STATES PATENT AND TRADEMARK OFFICE
CERTIFICATE OF CORRECTION

PATENT NO. : 5,146,468
DATED : September 08, 1992
INVENTOR(S) : H. KIMURA ET AL It is certified that error appears in the above-identified patent and that said Letters Patent is hereby corrected as shown below:

Column 7:
Claim 18, line 2, delete "5%" and insert instead --15%--.

Signed and Sealed this

Twelfth Day of September, 1995

Attest:

BRUCE LEHMAN

Attesting Officer      Commissioner of Patents and Trademarks